(12) United States Patent
Ye

(10) Patent No.: US 7,988,470 B2
(45) Date of Patent: Aug. 2, 2011

(54) METHODS OF FABRICATING METAL OXIDE OR METAL OXYNITRIDE TFTS USING WET PROCESS FOR SOURCE-DRAIN METAL ETCH

(75) Inventor: Yan Ye, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/884,572

(22) Filed: Sep. 17, 2010

(65) Prior Publication Data

US 2011/0070691 A1  Mar. 24, 2011

Related U.S. Application Data

(60) Provisional application No. 61/245,463, filed on Sep. 24, 2009.

(51) Int. Cl.
*H01L 21/00* (2006.01)
*H01L 21/336* (2006.01)

(52) U.S. Cl. ........ 439/149; 438/290; 438/479; 438/597; 438/652; 257/E21.231; 257/E21.257; 257/E21.4; 257/E21.411

(58) Field of Classification Search ................ 438/149, 438/290, 479, 597, 625, 642, 652, 658
See application file for complete search history.

(56) References Cited

U.S. PATENT DOCUMENTS

| | | | |
|---|---|---|---|
| 4,436,770 A | 3/1984 | Nishizawa et al. | |
| 4,695,432 A | 9/1987 | Colin et al. | |
| 4,769,291 A | 9/1988 | Belkind et al. | |
| 4,816,082 A | 3/1989 | Guha et al. | |
| 4,983,360 A | 1/1991 | Merdrignac et al. | |
| 5,279,679 A | 1/1994 | Murakami et al. | |
| 5,346,601 A | 9/1994 | Barada et al. | |
| 5,352,300 A | 10/1994 | Niwa et al. | |
| 5,420,452 A | 5/1995 | Tran et al. | |
| 5,522,934 A | 6/1996 | Suzuki et al. | |
| 5,571,749 A | 11/1996 | Matsuda et al. | |

(Continued)

FOREIGN PATENT DOCUMENTS

CN   1588623 A   3/2005

(Continued)

OTHER PUBLICATIONS

Toyoura et al., "Optical properties of zinc nitride formed by molten salt electrochemical process", Thin Film Solids 492 (2005), pp. 88-92.

(Continued)

*Primary Examiner* — Hsien Ming Lee
(74) *Attorney, Agent, or Firm* — Patterson & Sheridan, L.L.P.

(57) ABSTRACT

The present invention generally relates to thin film transistors (TFTs) and methods of making TFTs. The active channel of the TFT may comprise one or more metals selected from the group consisting of zinc, gallium, tin, indium, and cadmium. The active channel may also comprise nitrogen and oxygen. To protect the active channel during source-drain electrode patterning, an etch stop layer may be deposited over the active layer. The etch stop layer prevents the active channel from being exposed to the plasma used to define the source and drain electrodes. The etch stop layer and the source and drain electrodes may be used as a mask when wet etching the active material layer that is used for the active channel.

20 Claims, 8 Drawing Sheets

U.S. PATENT DOCUMENTS

| | | | |
|---|---|---|---|
| 5,620,523 A | 4/1997 | Maeda et al. | |
| 5,668,663 A | 9/1997 | Varaprasad et al. | |
| 5,683,537 A | 11/1997 | Ishii | |
| 5,700,699 A | 12/1997 | Han et al. | |
| 5,716,480 A | 2/1998 | Matsuyama et al. | |
| 5,720,826 A | 2/1998 | Hayashi et al. | |
| 5,731,856 A | 3/1998 | Kim et al. | |
| 5,993,594 A | 11/1999 | Wicker et al. | |
| 6,150,668 A | 11/2000 | Bao et al. | |
| 6,153,013 A | 11/2000 | Sakai et al. | |
| 6,153,893 A | 11/2000 | Inoue et al. | |
| 6,159,763 A | 12/2000 | Sakai et al. | |
| 6,180,870 B1 | 1/2001 | Sano et al. | |
| 6,228,236 B1 | 5/2001 | Rosenstein et al. | |
| 6,238,527 B1 | 5/2001 | Sone et al. | |
| 6,329,269 B1 | 12/2001 | Hamada et al. | |
| 6,388,301 B1 | 5/2002 | Tawada et al. | |
| 6,458,673 B1 | 10/2002 | Cheung | |
| 6,488,824 B1 | 12/2002 | Hollars et al. | |
| 6,566,180 B2 | 5/2003 | Park et al. | |
| 6,620,719 B1 | 9/2003 | Andry et al. | |
| 6,700,057 B2 | 3/2004 | Yasuno | |
| 6,787,010 B2 | 9/2004 | Cuomo et al. | |
| 6,825,134 B2 | 11/2004 | Law et al. | |
| 6,881,305 B2 | 4/2005 | Black et al. | |
| 6,890,803 B2 | 5/2005 | Lin et al. | |
| 6,943,359 B2 | 9/2005 | Vardeny et al. | |
| 6,953,947 B2 | 10/2005 | Son et al. | |
| 7,026,713 B2 | 4/2006 | Hoffman et al. | |
| 7,037,157 B2 | 5/2006 | Murakami et al. | |
| 7,145,174 B2 | 12/2006 | Chiang et al. | |
| 7,158,208 B2 | 1/2007 | De Jager et al. | |
| 7,189,992 B2 | 3/2007 | Wager, III et al. | |
| 7,235,810 B1 | 6/2007 | Yamazaki et al. | |
| 7,297,977 B2 | 11/2007 | Hoffman et al. | |
| 7,309,895 B2 | 12/2007 | Hoffman et al. | |
| 7,339,187 B2 | 3/2008 | Wager, III et al. | |
| 7,378,286 B2 | 5/2008 | Hsu et al. | |
| 7,382,421 B2 | 6/2008 | Hoffman et al. | |
| 7,601,984 B2 | 10/2009 | Sano et al. | |
| 7,626,201 B2 | 12/2009 | Chiang et al. | |
| 7,629,191 B2 | 12/2009 | Chiang et al. | |
| 7,750,440 B2 | 7/2010 | Yagi | |
| 7,879,698 B2 * | 2/2011 | Ye | 438/479 |
| 2002/0117719 A1 | 8/2002 | Ando et al. | |
| 2002/0149053 A1 | 10/2002 | Tsunoda et al. | |
| 2003/0015234 A1 | 1/2003 | Yasuno | |
| 2003/0049464 A1 | 3/2003 | Glenn et al. | |
| 2003/0207093 A1 | 11/2003 | Tsuji et al. | |
| 2004/0018797 A1 | 1/2004 | Murakami et al. | |
| 2004/0113098 A1 | 6/2004 | Vardeny et al. | |
| 2004/0164294 A1 | 8/2004 | Son et al. | |
| 2004/0175511 A1 | 9/2004 | Hartig | |
| 2004/0235224 A1 | 11/2004 | Lin et al. | |
| 2005/0017244 A1 | 1/2005 | Hoffman et al. | |
| 2005/0028860 A1 | 2/2005 | Sano et al. | |
| 2005/0062057 A1 | 3/2005 | Yamazaki et al. | |
| 2005/0062409 A1 | 3/2005 | Yamazaki et al. | |
| 2005/0067953 A1 | 3/2005 | Yamazaki et al. | |
| 2005/0181532 A1 | 8/2005 | Patel et al. | |
| 2005/0181534 A1 | 8/2005 | Yoshimi et al. | |
| 2005/0233092 A1 | 10/2005 | Choi et al. | |
| 2005/0233595 A1 | 10/2005 | Choi et al. | |
| 2005/0251990 A1 | 11/2005 | Choi et al. | |
| 2006/0011139 A1 | 1/2006 | Sterling et al. | |
| 2006/0033106 A1 | 2/2006 | Seo et al. | |
| 2006/0038182 A1 | 2/2006 | Rogers et al. | |
| 2006/0043447 A1 | 3/2006 | Ishii et al. | |
| 2006/0046476 A1 | 3/2006 | Nakamura et al. | |
| 2006/0065299 A1 | 3/2006 | Fukawa et al. | |
| 2006/0108636 A1 | 5/2006 | Sano et al. | |
| 2006/0125098 A1 | 6/2006 | Hoffman et al. | |
| 2006/0258064 A1 | 11/2006 | Chen et al. | |
| 2006/0286725 A1 | 12/2006 | Cheng et al. | |
| 2007/0007125 A1 | 1/2007 | Krasnov et al. | |
| 2007/0026321 A1 | 2/2007 | Kumar | |
| 2007/0030569 A1 | 2/2007 | Lu et al. | |
| 2007/0057261 A1 | 3/2007 | Jeong et al. | |
| 2007/0065962 A1 | 3/2007 | Pichler | |
| 2007/0068571 A1 | 3/2007 | Li et al. | |
| 2007/0141784 A1 | 6/2007 | Wager et al. | |
| 2007/0194379 A1 | 8/2007 | Hosono et al. | |
| 2007/0252129 A1 | 11/2007 | Yagi | |
| 2007/0252147 A1 | 11/2007 | Kim et al. | |
| 2007/0252152 A1 | 11/2007 | Sato et al. | |
| 2008/0108198 A1 | 5/2008 | Wager et al. | |
| 2008/0132009 A1 | 6/2008 | Hirai | |
| 2008/0173870 A1 | 7/2008 | Kim et al. | |
| 2008/0224133 A1 | 9/2008 | Park et al. | |
| 2008/0264777 A1 | 10/2008 | Ye | |
| 2008/0272388 A1 | 11/2008 | Ushiyama et al. | |
| 2008/0308411 A1 | 12/2008 | Guo et al. | |
| 2009/0023959 A1 * | 1/2009 | D'Amore et al. | 568/698 |
| 2009/0026065 A1 | 1/2009 | Nukeaw et al. | |
| 2009/0045398 A1 | 2/2009 | Kato et al. | |
| 2009/0050884 A1 | 2/2009 | Ye | |
| 2009/0212287 A1 | 8/2009 | Nathan et al. | |
| 2009/0233424 A1 | 9/2009 | Ye | |
| 2009/0236597 A1 * | 9/2009 | Ye | 257/43 |
| 2009/0239335 A1 | 9/2009 | Akimoto et al. | |
| 2009/0305461 A1 | 12/2009 | Akimoto et al. | |
| 2010/0001274 A1 * | 1/2010 | Ye | 257/57 |
| 2010/0078633 A1 | 4/2010 | Watanabe | |
| 2010/0090215 A1 | 4/2010 | Lee | |
| 2010/0109002 A1 | 5/2010 | Itagaki et al. | |
| 2010/0117073 A1 | 5/2010 | Yamazaki et al. | |
| 2010/0120197 A1 | 5/2010 | Levy et al. | |
| 2010/0140611 A1 | 6/2010 | Itagaki et al. | |
| 2010/0193783 A1 | 8/2010 | Yamazaki et al. | |
| 2010/0252832 A1 | 10/2010 | Asano et al. | |

FOREIGN PATENT DOCUMENTS

| | | |
|---|---|---|
| EP | 145403 A2 | 6/1985 |
| JP | 02-240637 A | 9/1990 |
| JP | 06-045354 A | 2/1994 |
| JP | 3958605 | 5/2007 |
| KR | 1999009046 | 3/1999 |
| KR | 2001-0011855 A | 2/2001 |
| KR | 2001051193 | 6/2001 |
| WO | WO-2008/133345 A1 | 11/2008 |
| WO | WO-2010/002803 | 1/2010 |

OTHER PUBLICATIONS

Ma et al., "Method of control of nitrogen content in ZnO films: Structural and photoluminescence properties", J. Vac. Sci. Technol. B 22(1), Jan./Feb. 2004, pp. 94-98.

Fortunato et al., "Wide-bandgap high-mobility ZnO thin-film transistors produced at room temperature", Applied Physics Letters, vol. 85, No. 13, Sep. 27, 2004, pp. 2541-2543.

Hoffman et al., "ZnO-based transparent thin-film transistors", Applied Physics Letters, vol. 82, No. 5, Feb. 3, 2003, pp. 733-735.

Zong et al., "Optical band gap of zinc nitride films prepared on quartz substrates from a zinc nitride target by reactive rf magnetron sputtering", Applied Surface Science 252 (2006), pp. 7983-7986.

Bain et al., "Deposition and electrical properties of N-In codoped p-type ZnO films by ultrasonic spray pyrolysis", Applied Physics Letters, vol. 84, No. 4, Jan. 26, 2004, pp. 541-543.

Barnes et al., "On the formation and stability of p-type conductivity in nitrogen-doped zinc oxide", Applied Physics Letters, 86, 112112 (2005).

Hirao et al., "4.1: Distinguished Paper: High Mobility Top-Gate Zinc Oxide Thin-Film Transistors (ZnO-TFTs) for Active-Matrix Liquid Crystal Displays", SID 06 Digest (2006), pp. 18-20.

Hosano et al., "Working hypothesis to explore novel wide band gap electrically conducting amorphous oxides and examples", Journal of Non-Crystalline Solids, 198-200 (1996) pp. 165-169.

Park et al., "Highly Stable $Ga_2O_3$-$In_2O_3$-ZnO Thin-Film Transistors for AM-OLED Application", IDW '07, pp. 1775-1778.

Kwon et al., "4 inch QVGA AMOLED display driven by GaInZnO TFT", IDW '07, pp. 1783-1786.

Perkins et al., "Identification of nitrogen chemical states in N-doped ZnO via x-ray photoelectron spectroscopy", Journal of Applied Physics 97, 034907 (2005).

Yao et al., "Effects of nitrogen doping and illumination on lattice constants and conductivity behavior of zinc oxide grown by magnetron sputtering", Journal of Applied Physics 99, 123510 (2006).

Tu et al., "Nitrogen-doped p-type ZnO films prepared from nitrogen gas radio-frequency magnetron sputtering", Journal of Applied Physics 100, 053705 (2006).

Klaitabtim et al., "Growth and Characterization of Zinc Oxynitride Thin Films by Reactive Gas-Timing RF Magnetron Sputtering", Japanese Journal of Applied Physics, vol. 47, No. 1, 2008, pp. 653-656.

Lee et al., "42.2: World's Largest (15-inch) XGA AMLCD Panel Using IGZO Oxide TFT", SID 08 Digest, pp. 625-628.

Zong et al., "Structural properties of zinc nitride empty balls", Materials Letters 60 (2006), pp. 905-908.

Nomura et al., "Room-temperature fabrication of transparent flexible thin-film transistors using amorphous oxide semiconductors", Nature, vol. 432, Nov. 25, 2004, pp. 788-492.

Minami, Tadatsugu, "New n-Type Transparent Conducting Oxides", MRS Bulletin, Aug. 2000.

Zong et al., "Synthesis and thermal stability of $Zn_3N_2$ powder", Solid State Communications 132 (2004), pp. 521-525.

Kaminska et al., "Transparent p-type ZnO films obtained by oxidation of sputter-deposited $Zn_3N_2$", Solid State Communications, 135 (2005), pp. 11-15.

Son et al., "42.4L: Late-News Paper: 4 inch QVGA AMOLED Driven by the Threshold Voltage Controlled Amorphous GIZO ($Ga_2O_3$-$In_2O_3$-ZnO) TFT", SID 08 Digest, pp. 633-636.

Futushara et al., "Optical properties of zinc oxynitride thin films", Thin Film Solids, 317 (1998), pp. 322-325.

Futushara et al., "Structural, electrical and optical properties of zinc nitride thin films prepared by reactive rf magnetron sputtering", Thin Film Solids, 322 (1998), pp. 274-281.

Carcia et al., "Transparent ZnO thin-film transistor fabricated by rf magnetron sputtering", Applied Physics Letters, col. 82, No. 7, Feb. 17, 2003, pp. 1117-1119.

Yan et al., "Control of Doping by Impurity Chemical Potentials: Predictions for p-type ZnO", Physical Review Letters, vol. 86, No. 25, Jun. 18, 2001, pp. 5723-5726.

Ohya et al., "Thin Film Transistor of ZnO Fabricated by Chemical Solution Deposition", Jpn. J. Appl. Phys., vol. 40 (2001), pp. 297-298.

Hossain, et al., "Modeling and simulation of polycrystalline ZnO thin-film transistors", Journal of Applied Physics, vol. 94, No. 12, Dec. 15, 2003, pp. 7768-7777.

Park et al., "Challenge to Future Displays: Transparent AM-OLED driven by PEALD grown ZnO TFT", IMID '07 Digest, pp. 1249-1252.

Hirao et al., "Bottom-Gate Zinc Oxide Thin-Film Transistors (ZnO TFTs) for AM-LCDs", IEEE Transactions on Electron Devices, col. 55, No. 11, Nov. 2008, pp. 3136-3142.

Zong et al., "Optical band gap of zinc nitride films prepared on quartz substrates from a zinc nitride target by reactive rf magnetron sputtering", Applied Surface Science 252 (2006), pp. 7983-7986.

Tu et al., "Nitrogen-doped p-type ZnO films prepared from nitrogen gas radio-frequency magnetron sputtering", Journal of Applied Physics 100, 053705 (2006).

Futushara et al., "Optical properties of zinc oxynitride thin films", Thin Film Solids, 317 (1998), pp. 322-325.

Ozgur, et al. "A comprehensive review of ZnO materials and devices," Journal of Applied Physics 98, 041301 (2005), American Institute of Physics.

Wang, et al. "Epitaxial growth of NH3-doped ZnO thin films on <0224> oriented sapphire substrates", Journal of Crystal Growth 255, Apr. 9, 2003, pp. 293-297.

Ye, et al. "Preparation and characteristics of p-type ZnO films by DC reactive magnetron sputtering," Journal of Crystal Growth 253, Feb. 4, 2003, pp. 258-264.

Korean Office Action dated Jul. 21, 2008 for Korean Application No. 10-2007-0066962.

Hiramatsu, et al. "Formation of TiN films with low Cl concentration by pulsed plasma chemical vapor deposition," American Vacuum Society, vol. 14, No. 3, May/Jun. 1996, pp. 1037-1040.

Son et al., "Threshold Voltage Control of Amorphous Gallium Indium Zinc Oxide TFTs by Suppressing Back-Channel Current" Electrochemical and Solid-State Letters, 12 (1) H26-H28 (2009).

Fortunato, et al. "Fully transparent ZnO thin-film transistor produced at room temperature," Advanced Materials, 2005, 17, No. 5, Mar. 6, 2005, Wiley-VCH verlag Gbmh & Co. KGaA, Weinheim, pp. 590-594.

Hiramatsu et al. "4.1: Distinguished Paper: High Mobility Top-Gate Zinc Oxide Thin-Film Transistors (ZnO-TFTs) for Active-Matrix Liquid Crystal Displays," SID 06 Digest ISSN0006-0966X/06/3701-0018-$1.00+.00, 2006, pp. 18-20.

Li et al. "Progress in semiconducting oxide-based thin-film transistors for displays," Institute of Physics, Semicon. Sci. Technol. 20 (2005), pp. 720-725.

Masuda et al. "Transparent thin film transistors using ZnO as an active channel layer and their electrical properties," Journal of Applied Physics, vol. 93, No. 3, Feb. 1, 2003, American Institute of Physics, pp. 1624-1630.

International Search Report and Written Opinion dated Aug. 8, 2008 for International Application No. PCT/US08/59638.

International Search Report and Written Opinion dated Oct. 8, 2008 for International Application No. PCT/US08/71890.

International Search Report and Written Opinion dated Oct. 15, 2007 for International Application No. PCT/US07/66166.

Search Report and Written Opinion for PCT/US2009/049084 dated Jan. 25, 2010.

Freeman et al., "Chemical and Thin-Film Strategies for New Transparent Conducting Oxides", MRS Bulletin, Aug. 2000, p. 45-51.

Jin et al., "Optical properties of transparent and heat reflecting ZnO:Al films made by reactive sputtering", Appl. Phys. Lett. 51 (3), Jul. 20, 1987, p. 149-151.

Pei et al., "Optical and electrical properties of direct-current magnetron sputtered ZnO:Al films", Journal of Applied Physics, vol. 90, No. 7, Oct. 1, 2001, p. 3432-3436.

Gordon, "Criteria for Choosing Transparent Conductors", MRS Bulletin, Aug. 2000, p. 52-57.

European search report dated Jun. 30, 2010 for European Patent Application 08797025.7.

Barnes et al., "A comparison of plasma-activated N2/O2 and N2)/O2 mixtures for use in ZnO:N synthesis by chemical vapor deposition", Journal of Applied Physics, vol. 96, No. 12 (Dec. 2004).

Cao et al., "Low resistivity p-ZnO films fabricated by sol-gel spin coating", Applied Physics Letters, 88, 251116 (Jun. 2006).

Zhao et al., "Growth of nitrogen-doped p-type ZnO films by spray pyrolysis and their electrical and optical properties", Journal of Crystal Growth, 280 (May 2005), pp. 495-501.

Barnes et al., "A comparison of plasma-activated N2/O2 and N2O/O2 mixtures for use in ZnO:N synthesis by chemical vapor deposition", Journal of Applied Physics, vol. 96, No. 12 (Dec. 2004).

Zhao et al., "Growth of nitrogen-doped p-type ZnO films by spray pyrolysis and their electrical and optical properties", Journal of Crystal Growth, 280 (May 2005), 495-501.

Ye et al., "High mobility amorphous zinc oxynitride semiconductor material for thin film transistors", Journal of Applied Physics, 106, 074512 (2009).

Chiang et al., "High mobility transparent thin-film transistors with amorphous zinc tin oxide channel layer", Appl. Phys. Lett., 86, 013503 (2005).

Jackson et al., "High-performance flexible zinc tin oxide field-effect transistors", Applied Physics Letters, 87, 193503 (2005).

Lu, et al., "P-type ZnO films deposited by DC reactive magnetron sputtering at different ammonia concentrations," Materials Letters 57, Jan. 13, 2003, pp. 3311-3314.

First Office Action for Chinese Patent Application No. 200880015621.X dated Nov. 24, 2010.

Wang et al., "Fabrication and characteristics of the low-resistive p-type ZnO thin films by DC reactive magnetron sputtering", Materials Letters, vol. 60, p. 912-914, Dec. 31, 2006.

Wang, "The optical and electrical characteristics and the microstructure of Al doped zinc oxide thin films", Dept. of Information material science and engineering Guilin, vol. 25(02), p. 19-22, Apr. 20, 2005.

Li, "The growth of high quality ZnO thin films at low temperature by PECVD & study of its properties", Chinese doctoral dissertations & master's theses full-text database (doctor) basic sciences, Journal 2nd, A005-11, Dec. 15, 2002.

Search report and written opinion for PCT/US2009/047966 dated Dec. 27, 2010.

Search report and written opinion for PCT/US2009/049092 dated Dec. 27, 2010.

Lu et al., "p-type conduction in N-Al co-doped ZnO thin films", Applied Physics Letters, vol. 85, No. 15, Oct. 2004, p. 3134-3135.

Zhuge et al., "ZnO p-n homojunctions and ohmic contacts to Al-N-co-doped p-type ZnO", Applied Physics Letters, vol. 87, Aug. 2005.

dit Picard et al., "Detection of NH3 and H2S with thick film semiconductor sensors based on Cd2-xGeO4-x-3yN2y oxynitrides", Sensors and Actuators B, vol. 42, 1997, pp. 47-51.

Office Action for Chinese Patent Application No. 200880106291.5 dated Mar. 30, 2011.

International Search Report and Written Opinion for PCT/US2010/049239 dated May 4, 2011.

* cited by examiner

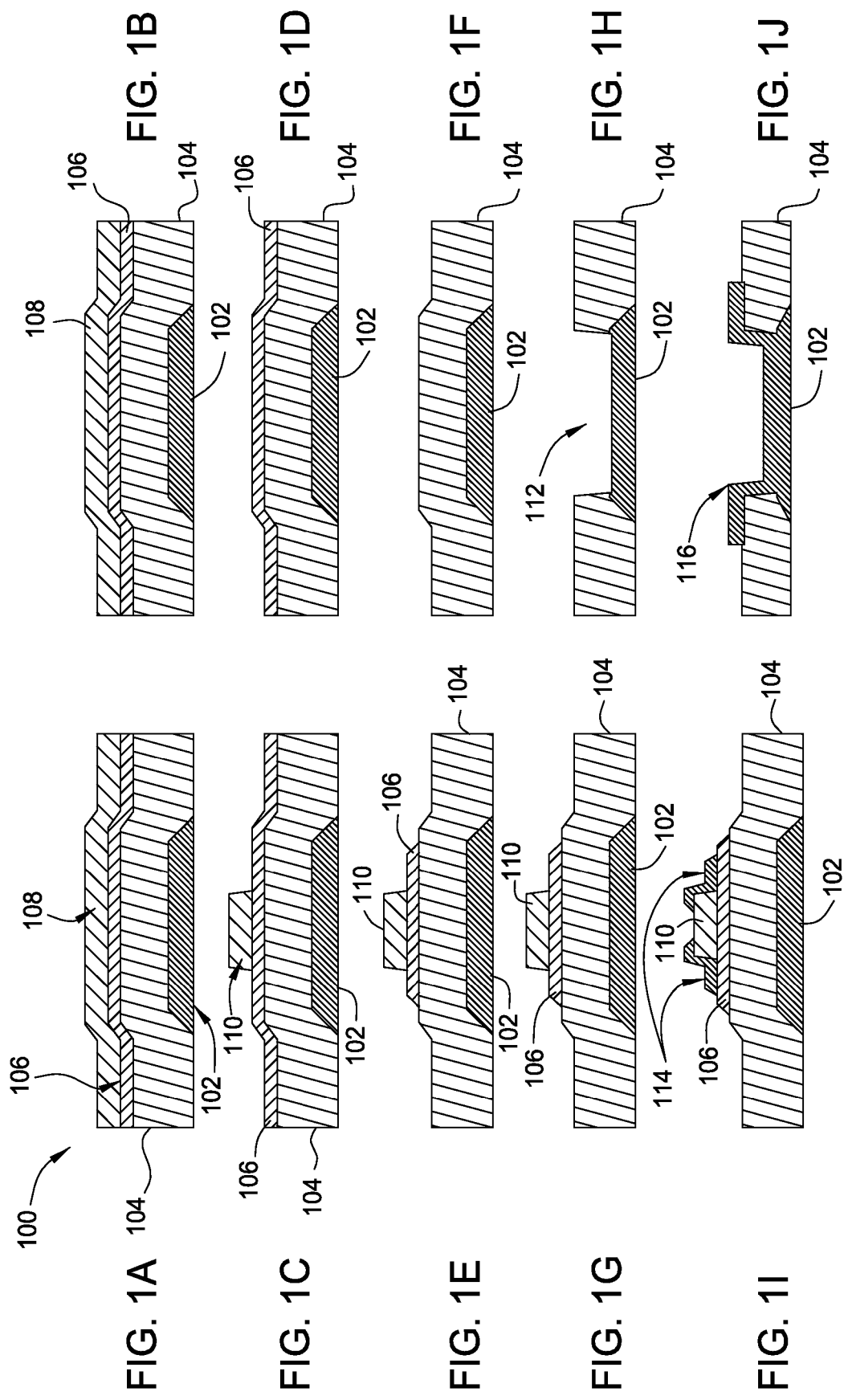

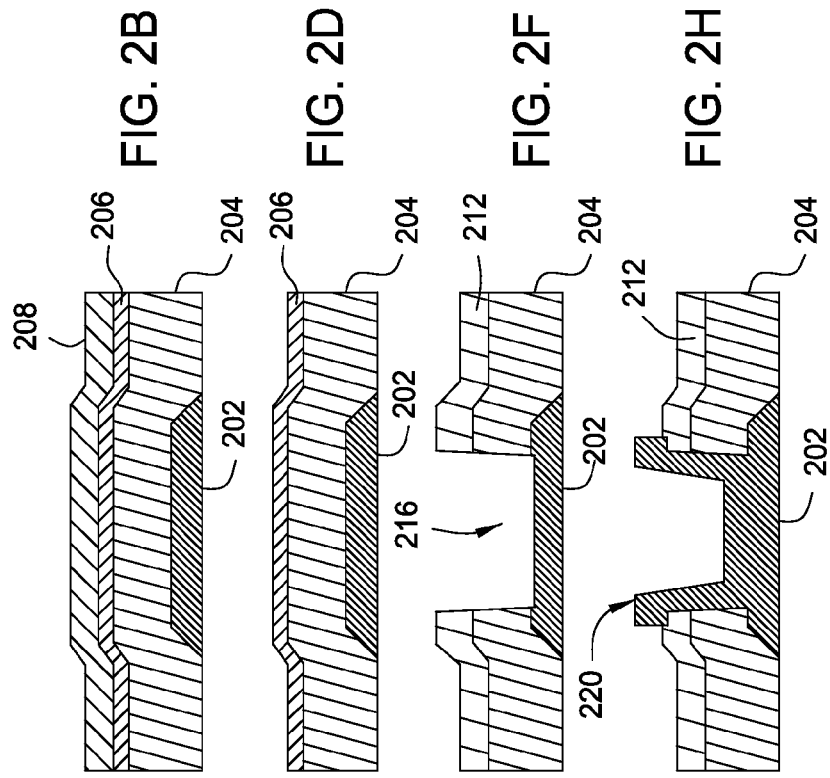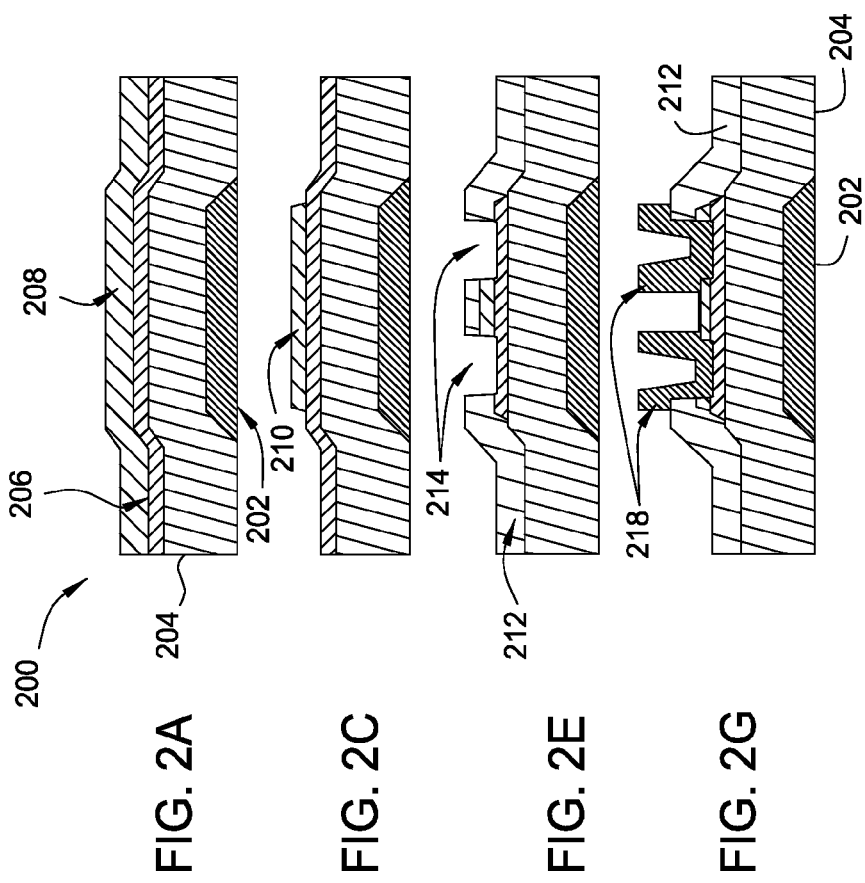

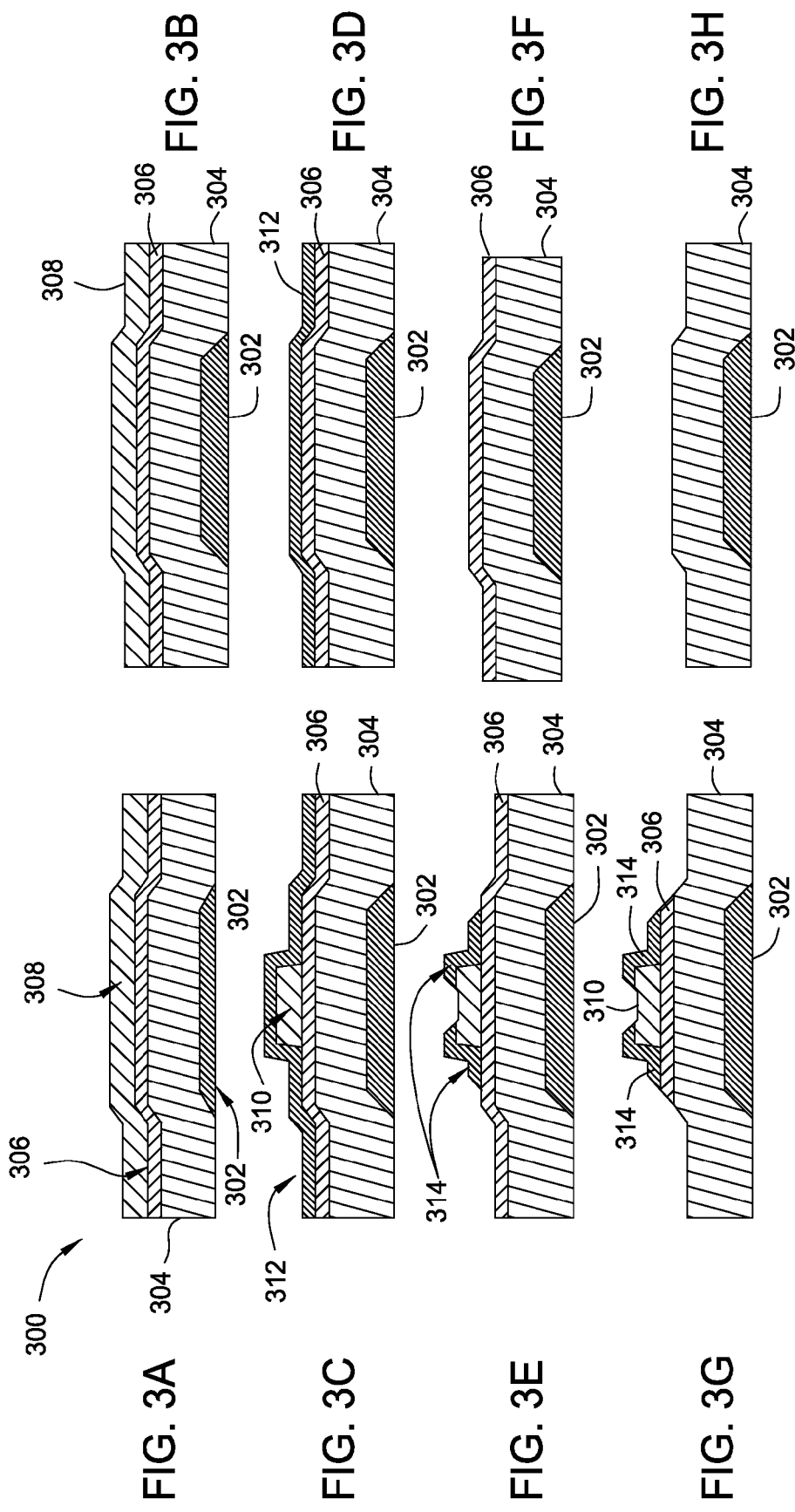

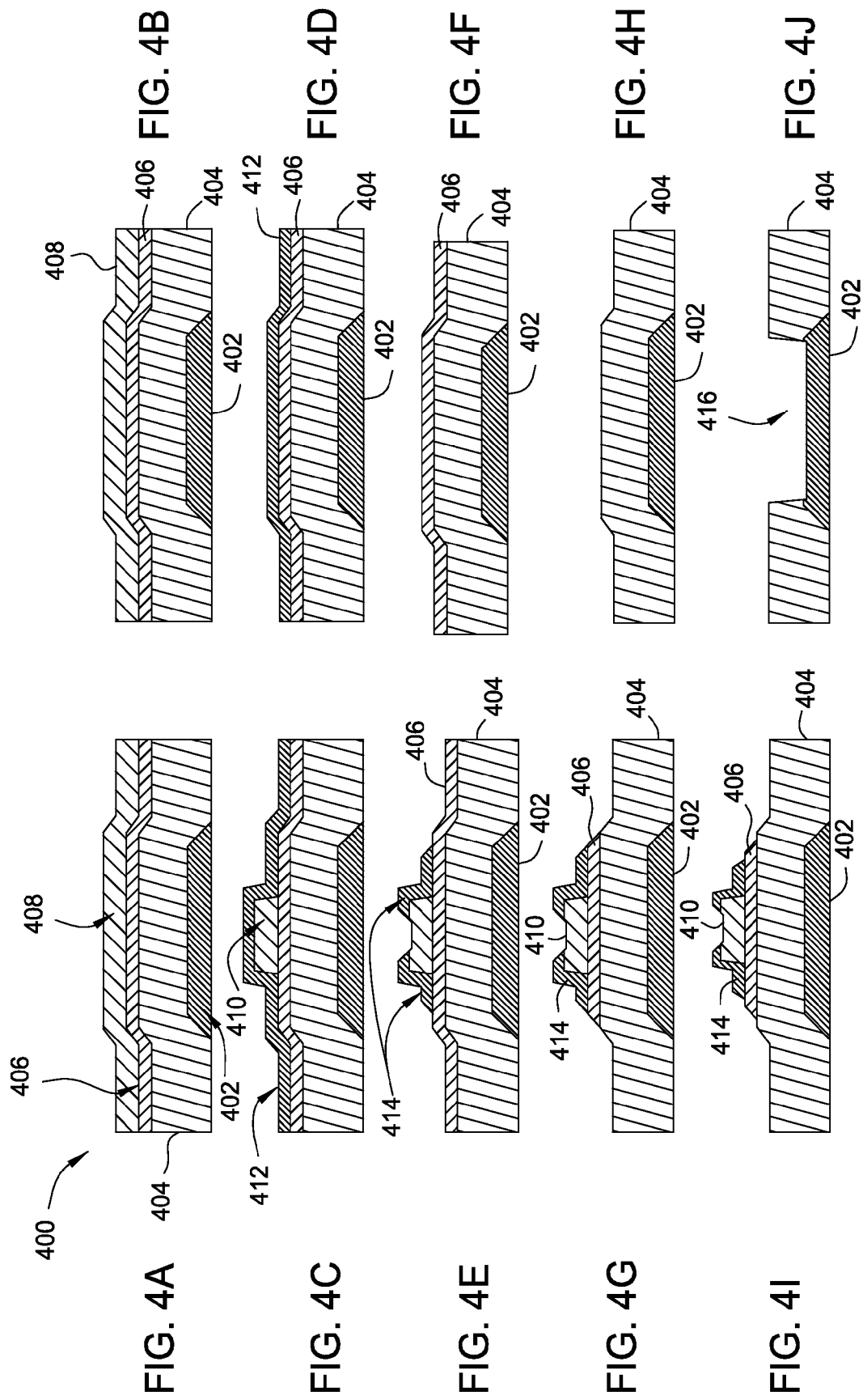

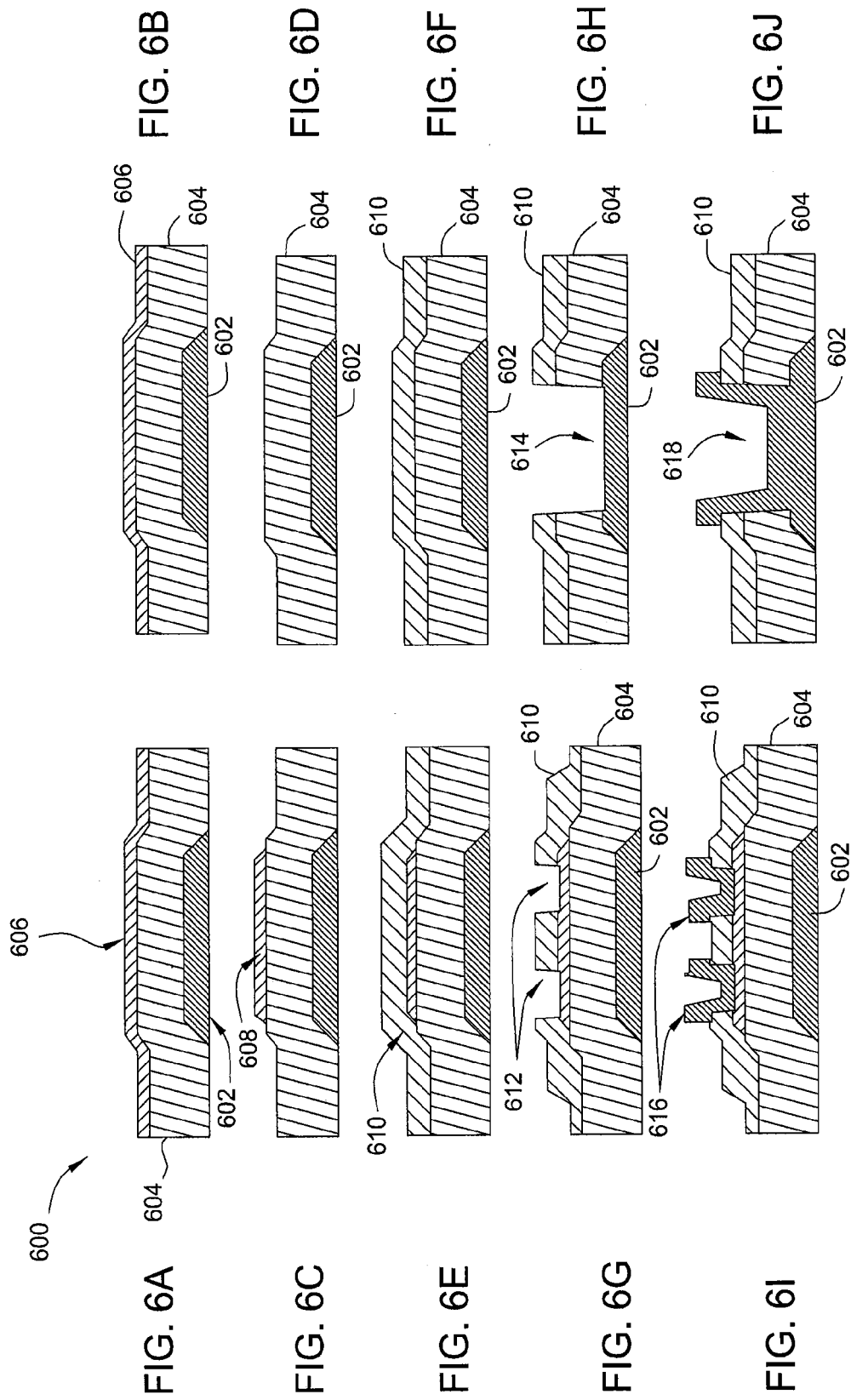

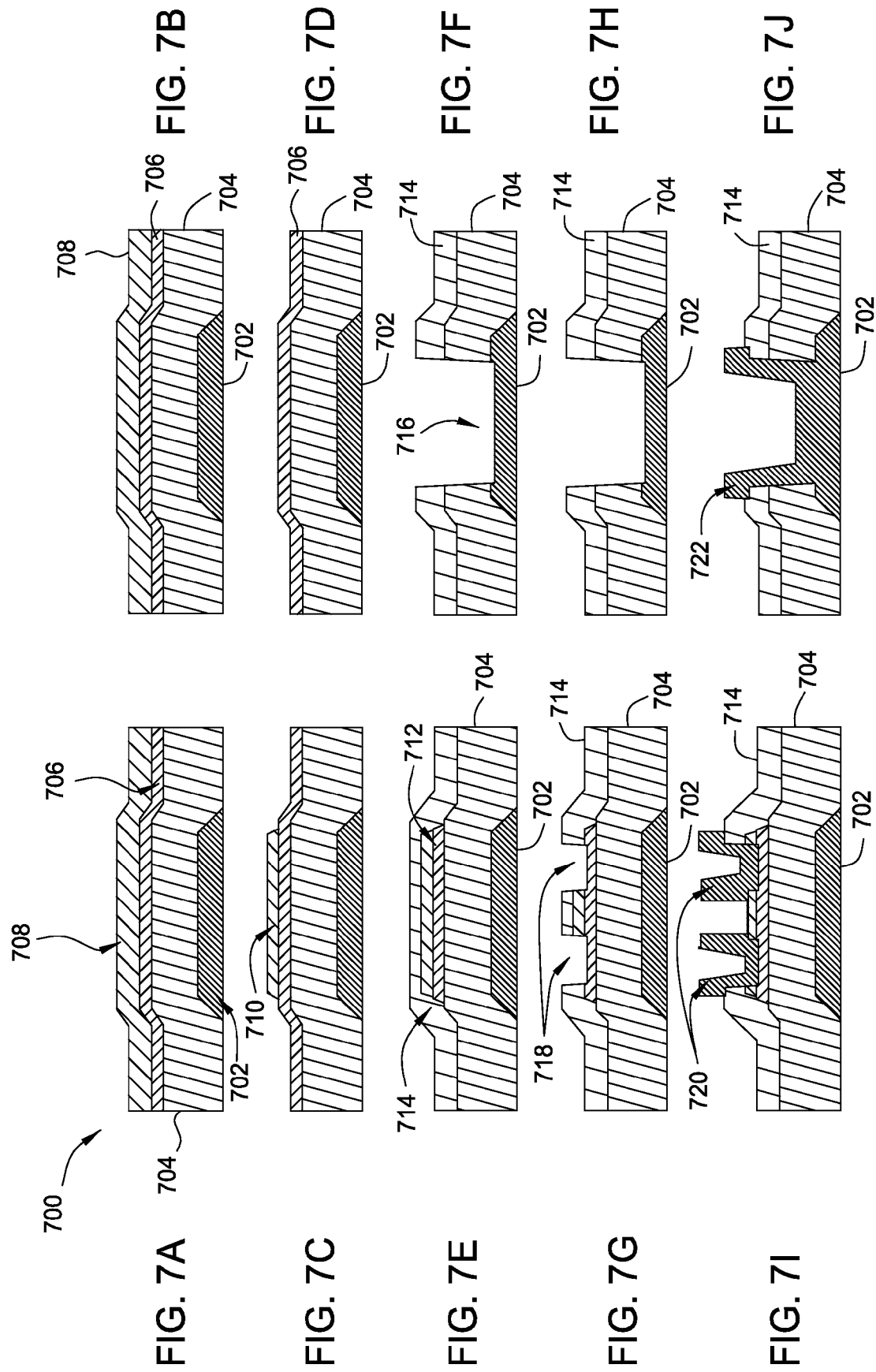

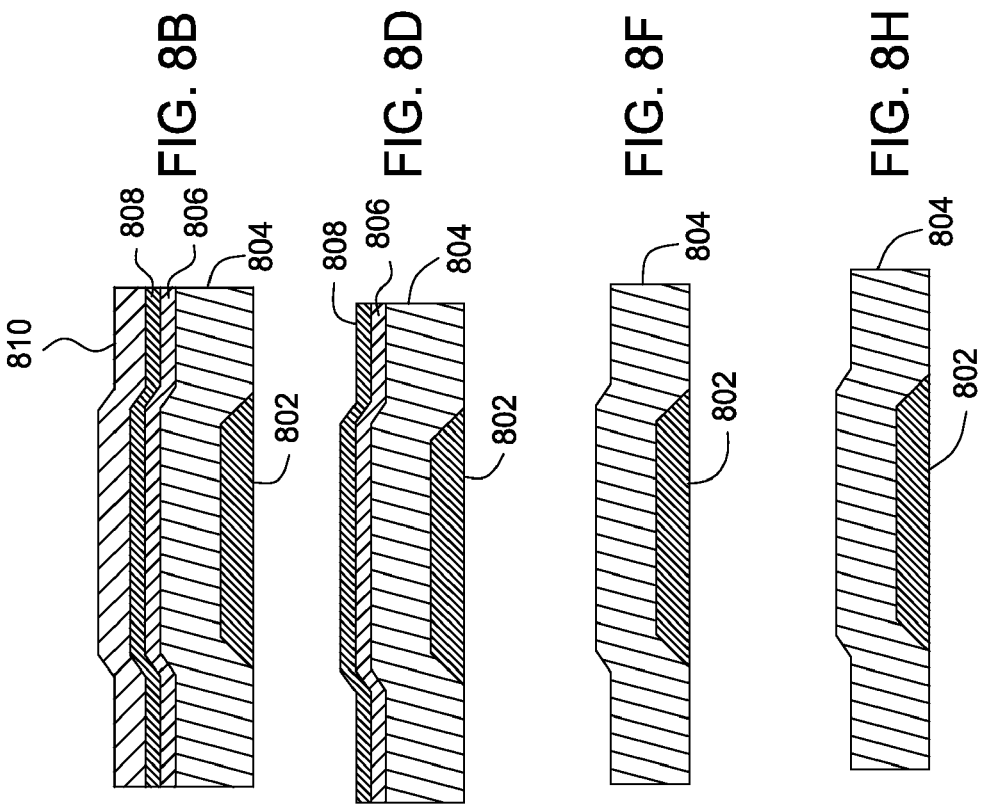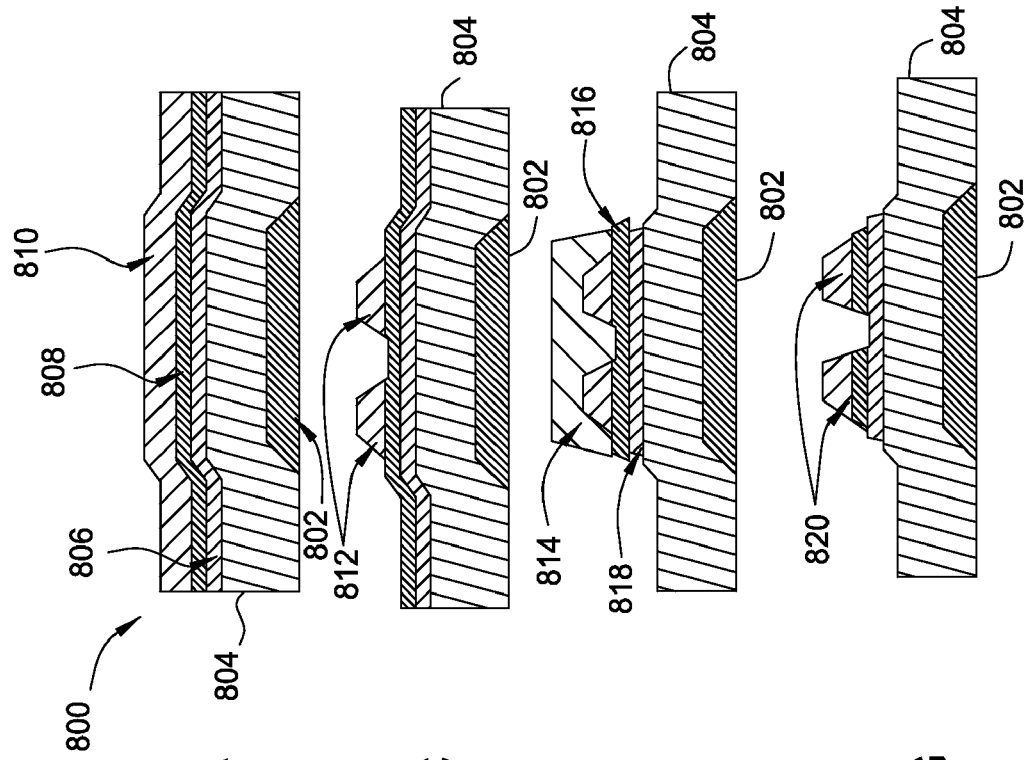

METHODS OF FABRICATING METAL OXIDE OR METAL OXYNITRIDE TFTS USING WET PROCESS FOR SOURCE-DRAIN METAL ETCH

CROSS-REFERENCE TO RELATED APPLICATIONS

This application claims benefit of U.S. Provisional Patent Application Ser. No. 61/245,463, filed Sep. 24, 2009, which is herein incorporated by reference.

GOVERNMENT RIGHTS IN THIS INVENTION

This invention was made with U.S. government support under Agreement No. DAAD19-02-3-0001 awarded by ARL. The U.S. government has certain rights in this invention.

BACKGROUND OF THE INVENTION

1. Field of the Invention

Embodiments of the present invention generally relate to a thin film transistor (TFT) fabrication method.

2. Description of the Related Art

Current interest in TFT arrays is particularly high because these devices may be used in liquid crystal active matrix displays (LCDs) of the kind often employed for computer and television flat panels. The LCDs may also contain light emitting diodes (LEDs) for back lighting. Further, organic light emitting diodes (OLEDs) have been used for active matrix displays, and these OLEDs utilize TFTs for addressing the activity of the displays.

TFTs made with amorphous silicon as the active material have become the key components of the flat panel display industry. There are two general types of TFTs in industry. The first type is called a top gate TFT because the gate electrode is located above the source and drain electrodes. The second type is called a bottom gate TFT because the gate electrode is located below the source and drain electrodes. In the bottom gate TFT structure, the source and drain electrodes are disposed over the active material layer.

The source and drain electrodes in a bottom gate TFT may be fabricated by depositing a metal layer over the active material layer and then etching the metal layer to define the source and drain electrodes. During the etching, the active material layer may be exposed to etch chemistry. Often, metal oxide or oxynitride semiconductors have less resistance to wet chemistry but have high resistance to plasma dry chemistry compared to the source-drain metals. Therefore, it is a challenge to etch source-drain metal electrodes using wet chemistry without significantly damage to the semiconductor channel layer. Thus, dry etch of the source-drain metal is often preferred. However, not all metals can be etched effectively through dry plasma etch, for example, copper. To prevent exposure of the active material layer to the undesired dry or wet etch chemistry, an etch stop or a dual metal layer may be used.

An etch stop bottom gate TFT has an etch stop layer deposited between the active material layer and the metal layer used for the source and drain electrodes. The etch stop layer is blanket deposited and then etched using a mask such that the remaining portion of the etch stop is disposed over the gate electrode. Thereafter, the metal layer is blanket deposited followed by etching the active material layer and the metal layer with a mask. Then, the source and drain electrodes are defined by etching through the metal layer using a mask. Thus, the etch stop bottom gate TFT utilizes at least five masks for the patterning (i.e., to pattern the gate electrode, to pattern the etch stop, to pattern the active material layer and metal layer, to expose the active material layer and form the active channel, and to define the source and drain electrodes). If a cross-dielectric contact is formed, then an additional mask may be used. The bottom gate TFTs without etch stops, by contrast, necessitate at least one less mask which therefore has made the bottom gate TFTs without etch stops the preferred TFT despite the better performance of the etch stop bottom gate TFTs.

In the multi-metal layer structure, the top metal can be etched with almost any dry or wet etch chemistry. The metal layer close to active channel layer is selected so that it will not be completely etched during the etching of the top metals, and it can be easily etched under certain process condition without harming the active layer. For example Cu can be selected as the top metal and Mo can be selected as the metal contacting the semiconductor.

Therefore, there is a need in the art for an etch stop bottom gate TFT fabrication method using wet metal etching chemistry that utilizes fewer masks.

SUMMARY OF THE INVENTION

The present invention generally relates to TFTs and methods of making TFTs. The active channel of the TFT may comprise one or more metals selected from the group consisting of zinc, gallium, tin, indium, and cadmium. The active channel may also comprise nitrogen and oxygen. To protect the active channel during source-drain electrode patterning, an etch stop layer may be deposited over the active layer. The etch stop layer prevents the active channel from being exposed to the plasma used to define the source and drain electrodes. The etch stop layer and the source and drain electrodes may be used as a mask when wet or dry etching the active material layer that is used for the active channel.

In one embodiment, a thin film transistor formation method is disclosed. The method includes depositing and patterning a gate electrode over a substrate using a first mask and depositing a gate dielectric layer over the gate electrode. The method also includes depositing a semiconductive active layer over the gate dielectric layer. The semiconductive active layer comprises oxygen, nitrogen, and one or more elements selected from the group consisting of zinc, indium, cadmium, gallium, and tin. The method also includes depositing an etch stop layer over the active layer, forming a second mask over the etch stop layer and etching the etch stop layer to form a patterned etch stop layer of the device portion of the thin film transistor and remove the etch stop layer from the gate contact portion of the thin film transistor to expose the semiconductive active layer. The method also includes removing the second mask to expose the patterned etch stop layer and depositing a metal layer over the patterned etch stop layer and the semiconductive active layer. The method also includes forming a third mask over the metal layer at the device portion of the thin film transistor and etching the metal layer to define a source electrode and a drain electrode at the device portion and remove the metal layer from the gate contact portion. The method also includes removing the third mask and etching the semiconductive active layer using the source electrode and the drain electrode as a mask to remove the semiconductive active layer from the gate contact portion and expose the gate dielectric layer in the gate contact portion. The method also includes etching the gate dielectric layer using a fourth mask to expose the gate contact in the gate contact portion.

In another embodiment, a thin film transistor formation method is disclosed. The method includes depositing and patterning a gate electrode over a substrate using a first mask and depositing a gate dielectric layer over the gate electrode. The method includes depositing a semiconductive active layer over the gate dielectric layer. The semiconductive active layer comprises oxygen, nitrogen, and one or more elements selected from the group consisting of zinc, indium, cadmium, gallium, and tin. The method also includes patterning the semiconductive active layer using a second mask to form an active channel in the device portion of the thin film transistor and remove the semiconductive active layer from a gate contact portion of the thin film transistor and expose the gate dielectric layer in the gate contact portion. The method also includes depositing an etch stop layer over the active channel in the device portion and over the gate dielectric layer in the gate contact portion and etching the etch stop layer using a third mask to form a patterned etch stop layer of the device portion and etch through the etch stop layer and the gate dielectric layer in the gate contact portion to expose the gate contact in the gate contact portion. The method also includes depositing a metal layer over the patterned etch stop layer, the semiconductive active layer, and the gate contact portion. The method also includes etching the metal layer with a fourth mask to define a source electrode and a drain electrode at the device portion and form a metal contact at the gate contact portion.

In another embodiment, a thin film transistor formation method is disclosed. The method includes depositing and patterning a gate electrode over a substrate using a first mask, depositing a gate dielectric layer over the gate electrode and depositing a semiconductive active layer over the gate dielectric layer. The semiconductive active layer comprises oxygen, nitrogen, and one or more elements selected from the group consisting of zinc, indium, cadmium, gallium, and tin. The method also includes depositing an etch stop layer over the active layer and etching the etch stop layer using a second mask to form a patterned etch stop layer of the device portion of the thin film transistor and remove the etch stop layer from the gate contact portion of the thin film transistor to expose the semiconductive active layer. The method also includes etching the semiconductive active layer using the patterned etch stop layer as a mask to expose the gate dielectric layer in the gate contact portion and form an active channel. The method also includes depositing a passivation layer over the device portion and the gate contact portion and etching through the passivation layer and the patterned etch stop layer using a third mask to expose the active channel in the device portion and etching through the passivation layer and gate dielectric layer in the gate contact portion to expose the gate electrode. The method also includes depositing a metal layer over the patterned etch stop layer and the semiconductive active layer and etching the metal layer using a forth mask to define a source electrode and a drain electrode at the device portion and a metal contact in the gate contact portion.

In another embodiment, a thin film transistor formation method is disclosed. The method includes depositing and patterning a gate electrode over a substrate using a first mask, depositing a gate dielectric layer over the gate electrode and depositing a semiconductive active layer over the gate dielectric layer. The semiconductive active layer comprises oxygen, nitrogen, and one or more elements selected from the group consisting of zinc, indium, cadmium, gallium, and tin. The method also includes depositing a first metal layer having a first composition over the active layer and depositing a second metal layer having a second composition different than the first composition over the first metal layer. The method also includes etching the second metal layer using a second mask to form one or more etch stops over a device portion of the thin film transistor while removing the second metal layer from a gate contact portion of the thin film transistor. The method also includes forming a third mask over the etched second metal layer and etching the first metal layer to remove the first metal layer from the gate contact portion and to form an etched first metal layer over the device portion. The method also includes etching the semiconductive active layer to form an active channel in the device portion and to remove the semiconductive active layer from the gate contact portion. The method also includes etching the etched first metal layer to form source and drain electrodes.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 1A-1J show a TFT in various stages of processing according to one embodiment.

FIGS. 2A-2H show a TFT in various stages of processing according to another embodiment.

FIGS. 3A-3H show a TFT in various stages of processing according to another embodiment.

FIGS. 4A-4J show a TFT in various stages of processing according to another embodiment.

FIGS. 6A-6J show a TFT in various stages of processing according to another embodiment.

FIGS. 7A-7J show a TFT in various stages of processing according to another embodiment.

FIGS. 8A-8H show a TFT in various stages of processing according to another embodiment.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 5A:
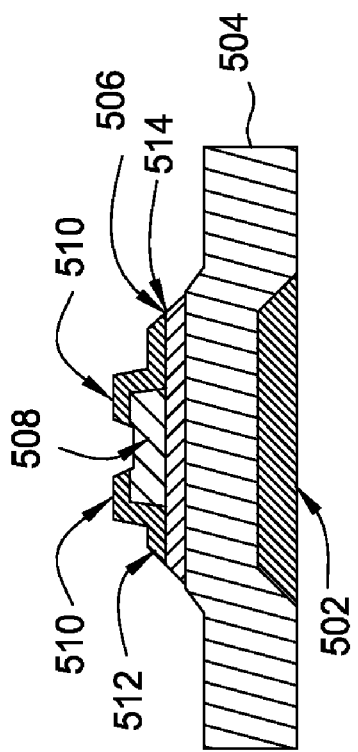
FIGS. 5A-5C show TFTS that have been fabricated using wet and dry etching techniques.

The present invention generally relates to TFTs and methods of making TFTs. The active channel of the TFT may comprise one or more metals selected from the group consisting of zinc, gallium, tin, indium, and cadmium. The active channel may or may not be doped. The active channel may also comprise nitrogen and oxygen. To protect the active channel during source-drain electrode patterning, an etch stop layer may be deposited over the active layer. The etch stop layer prevents the active channel from being exposed to the plasma used to define the source and drain electrodes. The etch stop layer and the source and drain electrodes may be used as a mask when wet etching the active material layer that is used for the active channel.

FIGS. 1A-1J show a TFT in various stages of processing according to one embodiment. In FIGS. 1A-1J, FIGS. 1A, 1C, 1E, 1G and 1I show the device portion while FIGS. 1B, 1D, 1F, 1H and 1J show the gate contact portion. The TFT is shown as a structure 100 in FIGS. 1A and 1B having a gate electrode 102, a gate dielectric layer 104 formed thereover, an active layer 106 formed over the gate dielectric layer 104 and finally an etch stop layer 108 formed over the active layer 106. The structure 100 may be formed over a substrate. In one embodiment, the substrate may comprise glass. In another embodiment, the substrate may comprise a polymer. In another embodiment, the substrate may comprise plastic. In another embodiment, the substrate may comprise metal. In one embodiment, the gate electrode 102 comprises a conductive material. In another embodiment, the gate electrode 102 comprises a metal. In another embodiment, the gate electrode 102 comprises a metal selected from the group consisting of chromium, molybdenum, aluminum, tungsten tantalum, copper, or combinations thereof. The gate electrode 102 may be formed using conventional techniques including sputtering, lithography, and etching using a first mask.

The gate dielectric layer 104 may comprise silicon dioxide, silicon oxynitride, silicon nitride, or combinations thereof. The gate dielectric layer 104 may be deposited by well known deposition techniques including plasma enhanced chemical vapor deposition (PECVD).

In one embodiment, the active layer 106 is annealed. In another embodiment, the active layer 106 is exposed to a plasma treatment. The annealing and/or plasma treatment may increase the mobility of the active layer 106. The active layer 106 may comprise a compound having one or more elements selected from the group consisting of zinc, tin, gallium, cadmium, and indium. In one embodiment, the element may comprise an element having a filled d orbital. In another embodiment, the element may comprise an element having a filled f orbital. The active layer 106 may also comprise oxygen and nitrogen. In one embodiment, the compound may be doped. Suitable dopants that may be used include Al, Sn, Ga, Ca, Si, Ti, Cu, Ge, In, Ni, Mn, Cr, V, Mg, $Si_xN_y$, $Al_xO_y$, and SiC. In one embodiment, the dopant comprises aluminum. In one embodiment, the active layer 106 may comprise oxygen and one or more elements selected from the group consisting of zinc, tin, gallium, cadmium, and indium.

The active layer 106 may be deposited by reactive sputtering. The reactive sputtering method may be practiced in a physical vapor deposition (PVD) chamber for processing large area substrates, such as a 4300 PVD chamber, available from AKT America, Inc., a subsidiary of Applied Materials, Inc., Santa Clara, Calif. However, because the active layer produced according to the method may be determined by the structure and composition, it should be understood that the reactive sputtering method may have utility in other system configurations, including those systems configured to process large area round substrates and those systems produced by other manufacturers, including roll-to-roll process platforms. It is to be understood that other methods including chemical vapor deposition (CVD), atomic layer deposition (ALD), or spin-on processes may be utilized to deposit the active layer 106.

For PVD, a sputtering target may contain one or more of zinc, indium, tin, gallium, and cadmium. One or more dopants may also be present. The sputtering may comprise full reactive sputtering. Full reactive sputtering comprises sputtering a target that does not contain the reactive material in an atmosphere forming the reactive material. Full reactive sputtering is distinct from RF reactive sputtering where a target contains not only the metal, but also the reactant. In RF reactive sputtering, the material is sputtered and then further reacted with additional reactant provided in the reactive gas.

For the present invention, the sputtering target for full reactive sputtering may comprise one or more of zinc, indium, tin, gallium, and cadmium, and a dopant may or may not be present. No oxygen or nitrogen is present in the target. The sputtering target may be DC biased while an inert gas, a nitrogen containing gas, and an oxygen containing gas are introduced into the sputtering chamber. The nitrogen of the nitrogen containing gas and the oxygen of the oxygen containing gas then react with the one or more of zinc, indium, tin, gallium, and cadmium to deposit the layer on the substrate. In one embodiment, the inert gas may comprise argon. In one embodiment, the nitrogen containing gas may be selected from the group of nitrogen, nitrogen oxide, and combinations thereof. In one embodiment, the oxygen containing gas may be selected from the group of oxygen, ozone, nitrogen oxide, and combinations thereof. The active layer 106 may be crystalline or semicrystalline. In one embodiment, the active layer 106 may be amorphous.

The etch stop layer 108 may be formed by blanket depositing, followed by photoresist depositing, followed by pattern developing. The etch stop layer 108 may be patterned by plasma etching using one or more gases selected from the group consisting of fluorine containing etchants such as $CF_4$, $C_2F_6$, $CHF_3$, $C_4F_6$, oxygen, nitrogen, inert gases such as argon, or combinations thereof. In one embodiment, the etch stop layer 108 may comprise silicon nitride. In another embodiment, the etch stop layer 108 may comprise silicon oxynitride. In still another embodiment, the etch stop layer 108 may comprise silicon oxide. The etch stop layer 108 may be deposited by well known deposition techniques including PECVD and spin-on coating. In one embodiment, the etch stop layer 108 may be pattern deposited utilizing a second mask. After the etch stop layer 108 is formed, the second mask may be removed so that an etch stop 110 may remain a shown in FIG. 1C. The etch stop layer 108 is completely removed over the gate contact portion of the structure 100 as shown in FIG. 1D.

Following the formation of the etch stop 110, the active layer 106 is etched to remove the unnecessary portions of the active material layer 106 as shown in FIG. 1E. The active material layer 106 is completely removed from the gate contact portion as shown in FIG. 1F. The etching is performed with a third mask.

Following the etching of the active material layer 106 and the gate dielectric layer 104, the gate contact via 112 is formed. To form the gate contact via 112, a fourth mask is deposited over the structure 100 and then the exposed gate dielectric layer 104 over the gate electrode 102 in the gate contact portion is etched to expose the gate electrode 102 as shown in FIG. 1H. The device portion remains unetched as shown in FIG. 1G. The fourth mask is then removed.

Following the exposure of the gate electrode 102, a metal layer may be deposited and etched. To etch the metal layer, a fifth mask may be used. The metal layer may be etched utilizing a plasma etch. In one embodiment, the plasma etching may comprise exposing the metal layer to a plasma containing a gas having an element selected from the group consisting of chlorine, oxygen, fluorine, or combinations thereof. A wet etchant may then be used to etch the active layer 106 as well as the source and drain electrodes 114 to define the final structure for both the active layer 106 and the source and drain electrodes 114. The wet etchant may comprise any conventional wet etchant that may etch the effective for etching the active layer 106 without etching the etch stop 110 and the source and drain electrodes 114. The etchant may comprise an acid with a pH of less than 3 of a base with a pH higher than 10. In one embodiment, the etchant may comprise diluted HCl. In another embodiment, the etchant may comprise the same liquid as used for developing the photoresist.

After the etching, the fifth mask may be removed and the source and drain electrodes 114 remain as shown in FIG. 1I and the metal connect 116 remains deposited in the gate contact via 112 in contact with the gate electrode 102 as shown in FIG. 1J. Thus, in forming the TFT shown in FIGS. 1A-1J, five separate masks are utilized.

FIGS. 2A-2H show a TFT in various stages of processing according to another embodiment. In FIGS. 2A-2H, FIGS. 2A, 2C, 2E and 2G show the device portion while FIGS. 2B, 2D, 2F and 2H show the gate contact portion. The structure 200 shown in FIGS. 2A and 2B includes a gate electrode 202, gate dielectric layer 204, active material layer 206 and etch stop layer 208 as described above. The gate electrode 202 may be formed by blanket depositing a conductive layer and then etching using a first mask.

The etch stop layer 208 may then be patterned by forming a second mask thereover. Once the second mask is removed, the etch stop 210 remains over the device portion as shown in FIG. 2C and no etch stop layer remains on the gate contact portion shown in FIG. 2D.

After formation of the etch stop 210 and the etch stop layer 208 has been removed from the gate contact portion, the active material layer 206 may be etched using a third mask and removed from the gate contact portion. A passivation layer 212 may be deposited thereover. The passivation layer 212 may be deposited to a thickness between about 1000 Angstroms to about 5000 Angstroms. In one embodiment, the passivation layer 212 may comprise silicon dioxide or silicon nitride. The passivation layer 212 is etched using a fourth mask to define the metal contact areas 214 of the active material layer 206 as shown in FIG. 2E and forming a opening 216 through the passivation layer 212 and gate dielectric layer 204 to expose the gate electrode 202 as shown in FIG. 2F. Thereafter, a metal layer may be deposited and patterned with a fifth mask to form the source and drain electrodes 218 as shown in FIG. 2G and the metal contact 220 with the gate electrode in the gate contact portion shown in FIG. 2H.

FIGS. 3A-3H show a TFT in various stages of processing according to another embodiment without a cross dielectric contact. In FIGS. 3A-3H, FIGS. 3A, 3C, 3E and 3G show the device portion while FIGS. 3B, 3D, 3F and 3H show the gate contact portion. The structure 300 includes a gate electrode 302, gate dielectric layer 304, active material layer 306 and an etch stop layer 308. As before, a first mask may be used to pattern the conductive layer used to form the gate electrode 302. A second mask may be used to pattern the etch stop layer 308 to form the etch stop 310 as shown in FIG. 3C and remove the etch stop layer 308 from the gate contact portion shown in FIG. 3D. A metal layer 312 is then deposited over the etch stop 310 and the active material layer 306. A third mask is then used to define the source and drain electrodes 314 as shown in FIG. 3E and remove the metal layer 312 from the gate contact portion such that the active material layer 306 remains over the gate contact portion as shown in FIG. 3F. The exposed active material layer 306 is then etched using the source and drain electrode 314 as a mask such that the active material layer 306 is removed from the gate contact portion as shown in FIG. 3H. Thus, only three masks utilized in the formation of the TFT shown in FIGS. 3A-3H. The source and drain electrodes, while functioning as a mask, are not deposited and removed solely for the purpose of patterning. In other words, there are three mask formation steps and three mask removal steps. To perform the etching, a dry etching process is preferred.

FIGS. 4A-4J show a TFT in various stages of processing according to another embodiment with a partial cross dielectric contact. In FIGS. 4A-4J, FIGS. 4A, 4C, 4E, 4G and 4I show the device portion while FIGS. 4B, 4D, 4F, 4H and 4J show the gate contact portion. The structure 400 shown in FIGS. 4A and 4B includes a gate electrode 402, a gate dielectric layer 404, an active material layer 406 and an etch stop layer 408. The gate electrode 402 may be formed by blanket depositing a conductive layer and then etching the conductive layer using a first mask. The etch stop layer 408 may be patterned by using a second mask to etch the etch stop layer 408 and form an etch stop 410 over the device portion while removing the etch stop layer 408 from the gate contact portion. A metal layer 412 is then deposited over the active material layer 806 and the etch stop 810 as shown in FIGS. 4C and 4D. The metal layer 412 is then patterned using a third mask to define the source and drain electrodes 414 on the device portion as shown in FIG. 4E and remove the metal layer 412 from the gate contact portion as shown in FIG. 4F. The active material layer 406 is then removed in the exposed areas using the source and drain electrodes 414 as a mask as shown in FIG. 4G such that the active material layer 406 is removed from the gate contact portion as shown in FIG. 4H. Thereafter, the gate electrode 402 is exposed in the gate contact portion shown in FIG. 4J by etching the gate electrode layer 404 using a fourth mask while the device portion remains unchanged as shown in FIG. 4I. For the etching, dry etching is the preferred etchant to utilize.

Figure 5B:
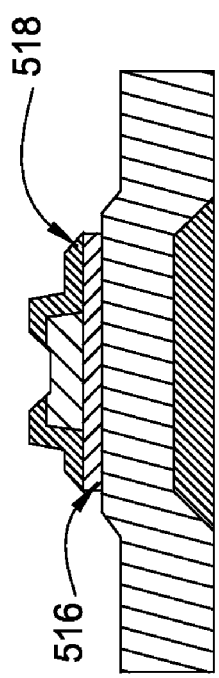
Figure 5C:
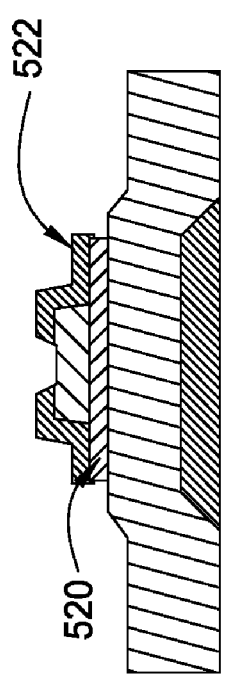

FIGS. 5A-5C show TFTS that have been fabricated using wet and dry etching techniques. The structures shown in FIGS. 5A-5C each have a gate electrode 502, a gate dielectric layer 504, an active material layer 506 and etch stop 508 and source and drain electrodes 510. In FIG. 5A, both the source and drain electrodes 510 as well as the active material layer 506 were patterned using a dry or plasma etching process. By etching with a dry or plasma etching process, the source and drain electrodes 510 each have a tapered profile 512. The active material layer 506 also has a tapered profile 514. However, when the active material layer 506 is patterned with a wet etchant and the source and rain electrodes 510 are patterned with a dry or plasma etchant, the active material layer 506 has an undercut portion 516 recessed from the source and drain electrodes 510 while the source and drain electrodes 510 have a tapered portion 518 as shown in FIG. 5B. When both the active material layer 506 and the source and drain electrodes 510 are etched with a wet etchant, the active material layer 506 has an undercut portion 522 that is recessed from the source and drain electrodes 510 while the source and drain electrodes 510 each have a straight portion 520 as shown in FIG. 5C. Thus, the choice of etching process may affect the device structure. In general, the dry or plasma etching process is preferred because it provides the tapered profiles without the undercut. Additionally, a single process recipe may e used to etch both the active material layer and the source and drain electrodes. If a wet etching process is used, then separate wet etch chemistries may be needed to etch the active material layer and the source and drain electrodes.

FIGS. 6A-6J show a TFT in various stages of processing according to another embodiment. In FIGS. 6A-6J, FIGS. 6A, 6C, 6E, 6G and 6I show the device portion while FIGS. 6B, 6D, 6F, 6H and 6J show the gate contact portion. The structure 600 shown in FIGS. 6A and 6B includes a gate electrode 602, a gate dielectric layer 604 and an active material layer 606. The gate electrode 602 is formed by depositing a conductive layer and then etching the conductive layer using a first mask. The active material layer 606 is then patterned using a second mask to form an active channel 608 on the device portion shown in FIG. 6C and completely removed from the gate contact portion as shown in FIG. 6D. Next, an etch stop layer 610 is deposited over the exposed gate dielectric layer 604 and the active channel 608. A third mask is then used to etch openings 612, 614 into the etch stop layer 610 in both the device portion as shown in FIG. 6G and the gate contact portion as shown in FIG. 6H. In the gate contact portion, the gate dielectric layer 604 is also etched. The gate dielectric layer 604 is covered by the active channel 608 in the device portion and hence is not etched. Thereafter, a conductive layer is deposited a patterned using a fourth mask to form the source and drain electrodes 616 at the device portion and the metal connect 618 at the gate contact portion. For the etching processes, either wet or dry etching would be suitable. However, note that only four masks are utilized to form the TFT.

FIGS. 7A-7J show a TFT in various stages of processing according to another embodiment. In FIGS. 7A-7J, FIGS. 7A, 7C, 7E, 7G and 7I show the device portion while FIGS. 7B, 7D, 7F, 7H and 7J show the gate contact portion. The structure 700 shown in FIGS. 7A and 7B includes a gate electrode 702, a gate dielectric layer 704, an active material layer 706 and an etch stop layer 708. The gate contact 702 may be formed by depositing a conductive layer and then etching the conductive layer using a first mask. The etch stop layer 708 may be etched using a second mask to form an etch stop 710 as shown in FIG. 7C and completely remove the etch stop layer 708 from the gate contact portion as shown in FIG. 7D. The active material layer 706 is then etched using the etch stop 710 as a mask to remove the active material layer 706 from the gate contact and to form an active channel 712. A passivation layer 714 is then deposited over the exposed gate dielectric layer 704 and the etch stop 710. The passivation layer 714 and the gate dielectric layer 704 and portions of the etch stop 710 are then etched using a third mask. The passivation layer 714 and gate dielectric layer 704 are etched to form an opening 716 at the gate contact portion as shown in FIGS. 7F and 7H and expose the gate electrode 702. The passivation layer 714 and the etch stop 710 are etched to expose the active channel 712 as shown in FIG. 7G. Thereafter, a metal layer is deposited and patterned using a fourth mask to form the source and drain electrodes 720 in the device portion shown in FIG. 7I and the metal contact 722 the gate contact portion as shown in FIG. 7J.

FIGS. 8A-8H show a TFT in various stages of processing according to another embodiment. In FIGS. 8A-8H, FIGS. 8A, 8C, 8E and 8G show the device portion while FIGS. 8B, 8D, 8F and 8H show the gate contact portion. The structure 800 includes a gate electrode 802, a gate dielectric layer 804, an active material layer 806, a first metal layer 808 and a second metal layer 810 as shown in both FIGS. 8A and 8B. The gate electrode 802 may comprise a material as discussed above. The gate electrode 802 may be formed by depositing a metal layer and then etching the met layer using a first mask.

Thereafter, the second metal layer 810 may be etched using a second mask to remove the second metal layer 810 over the gate contact portion as shown in FIG. 8D and leave etch stops 812 over the device portion as shown in FIG. 8C. In one embodiment, the second metal layer 810 may comprise a metal. In another embodiment, the second metal layer 810 may comprise copper. The second metal layer 810 may be etched using a wet etching chemistry. When the second metal layer 810 comprises copper, a wet etching chemistry is preferred because it is very difficult to etch copper with a dry or plasma etching process. In one embodiment, the second metal layer 810 and the first metal layer 808 comprise different metals. In another embodiment, the first metal layer comprises molybdenum and the second metal layer comprises copper. Molybdenum may be etched with either a dry/plasma etching process or using a wet etching chemistry.

After the second metal layer 810 has been etched to leave the etch stops 812, a photoresist may be deposited and patterned to form a third mask 814. Using the third mask 814, the first metal layer 808 may be etched using a dry or plasma etching process. During the etching of the first metal layer, the active material layer 806 is not significantly etched because the active material layer 806 is difficult to etch with a dry or plasma etch chemistry. After the first metal layer 808 has been etched to form an etched metal layer 816, the etched metal layer 816 is used as a mask to etch the active material layer 806 to form the active channel 818. Thus, the active channel 818 may be formed without depositing and forming a fourth mask. When the first metal layer 808 is etched and the active material layer 806 is etched, the first metal layer 808 and the active material layer 806 is completely removed from the gate contact portion as shown in FIGS. 8F and 8H.

After the active channel 818 has been formed as shown in FIG. 8E, the mask 814 may be stripped and the etch stops 812 may be used as a mask to etch the etched metal layer 816 using a dry or plasma etch process to form source and drain electrodes 820 as shown in FIG. 8G. Thus, the etched metal layer 816 is etched without needing to deposit another mask. Therefore, the process shown in FIGS. 8A-8H may be accomplished using five different etchings steps (i.e., to etch the gate electrode 802, the second metal layer 810, the first metal layer 808, the active material layer 806 and the already etched first metal layer 816) while forming and removing only three masks.

It is to be understood that there is a difference between (a) a mask formed for the express purpose of etching a layer and then removed after the etching and (b) a layer that serves a function in a device but is able to be used as a mask to etch a layer therebelow. In the scenarios described above, the gate electrode is patterned by physically depositing a layer, such as a photoresist, developing the photoresist to form a mask, etching the metal layer using the mask and removing the mask such that the remaining layer is the gate electrode. Some of the other layers, however, are etched using the layer above it as a mask. For example, the active material layer may be etched without the need or deposition of any photoresist layer or deposition of a mask. Rather than depositing a mask which is later removed, the etch stop or the source and drain electrodes may be used as a mask. Thus, while a 'mask' is used, the 'mask' is not a physically separate entity that is deposited and removed. By not utilizing additional masks, substrate throughput may be increased because, in the case of photoresist, deposition, development and removal of the mask is not needed.

By utilizing the source and drain electrodes as well as an etch stop as a mask, the active layer may be etched without depositing and removing an additional mask. Without the additional mask, several processing steps of prior art methods may be obsolete. By utilizing fewer masks, substrate throughput may be increased. Besides the benefits of utilizing fewer masks, both wet etching and dry or plasma etching may be utilized in the fabrication of TFTs. The selectivity of the wet etching and the selectivity of the dry or plasma etching may be used to the technicians advantage such that the individual layers of the device may be used, in essence, as masks so that separate masks do not need to be deposited and removed. Therefore, few masks may be utilized and substrate throughput may be increased.

While the foregoing is directed to embodiments of the present invention, other and further embodiments of the invention may be devised without departing from the basic scope thereof, and the scope thereof is determined by the claims that follow.

The invention claimed is:
1. A thin film transistor formation method, comprising:
depositing and patterning a gate electrode over a substrate using a first mask;

depositing a gate dielectric layer over the gate electrode;
depositing a semiconductive active layer over the gate dielectric layer, the semiconductive active layer comprising oxygen, nitrogen, and one or more elements selected from the group consisting of zinc, indium, cadmium, gallium, and tin;
depositing an etch stop layer over the semiconductive active layer;
forming a second mask over the etch stop layer;
etching the etch stop layer to form a patterned etch stop layer of a device portion of the thin film transistor and remove the etch stop layer from a gate contact portion of the thin film transistor to expose the semiconductive active layer;
removing the second mask to expose the patterned etch stop layer;
depositing a metal layer over the patterned etch stop layer and the semiconductive active layer;
forming a third mask over the metal layer at the device portion of the thin film transistor;
etching the metal layer to define a source electrode and a drain electrode at the device portion and remove the metal layer from the gate contact portion;
removing the third mask;
etching the semiconductive active layer using the source electrode and the drain electrode as a mask to remove the semiconductive active layer from the gate contact portion and expose the gate dielectric layer in the gate contact portion; and
etching the gate dielectric layer using a fourth mask to expose a gate contact in the gate contact portion.

2. The method of claim 1, wherein the metal layer and the semiconductive active layer are etched using a plasma etching process.

3. The method of claim 2, wherein the etching the semiconductive active layer comprises utilizing the source electrode, the drain electrode and the patterned etch stop layer collectively as a mask without depositing and removing a fifth mask.

4. The method of claim 1, wherein the semiconductive active layer is etched using a wet etching process and the metal layer is etched using a plasma etching process.

5. The method of claim 1, wherein the semiconductive active layer and the metal layer are etched using a wet etching process.

6. A thin film transistor formation method, comprising:
depositing and patterning a gate electrode over a substrate using a first mask;
depositing a gate dielectric layer over the gate electrode;
depositing a semiconductive active layer over the gate dielectric layer, the semiconductive active layer comprising oxygen, nitrogen, and one or more elements selected from the group consisting of zinc, indium, cadmium, gallium, and tin;
patterning the semiconductive active layer using a second mask to form an active channel in a device portion of the thin film transistor and remove the semiconductive active layer from a gate contact portion of the thin film transistor and expose the gate dielectric layer in the gate contact portion;
depositing an etch stop layer over the active channel in the device portion and over the gate dielectric layer in the gate contact portion;
etching the etch stop layer using a third mask to form a patterned etch stop layer in the device portion and etch through the etch stop layer and the gate dielectric layer in the gate contact portion to expose a gate contact in the gate contact portion;
depositing a metal layer over the patterned etch stop layer, the semiconductive active layer, and the gate contact portion; and
etching the metal layer with a fourth mask to define a source electrode and a drain electrode at the device portion and form a metal contact at the gate contact portion.

7. The method of claim 6, wherein the metal layer and the semiconductive active layer are etched using a plasma etching process.

8. The method of claim 3, wherein the semiconductive active layer is etched using a wet etching process and the metal layer is etched using a plasma etching process.

9. The method of claim 3, wherein the semiconductive active layer and the metal layer are etched using a wet etching process.

10. A thin film transistor formation method, comprising:
depositing and patterning a gate electrode over a substrate using a first mask;
depositing a gate dielectric layer over the gate electrode;
depositing a semiconductive active layer over the gate dielectric layer, the semiconductive active layer comprising oxygen, nitrogen, and one or more elements selected from the group consisting of zinc, indium, cadmium, gallium, and tin;
depositing an etch stop layer over the semiconductive active layer;
etching the etch stop layer using a second mask to form a patterned etch stop layer of a device portion of the thin film transistor and remove the etch stop layer from a gate contact portion of the thin film transistor to expose the semiconductive active layer;
etching the semiconductive active layer using the patterned etch stop layer as a mask to expose the gate dielectric layer and form an active channel in the device portion;
depositing a passivation layer over the device portion and the gate contact portion;
etching through the passivation layer and the patterned etch stop layer using a third mask to expose the active channel in the device portion and etching through the passivation layer and gate dielectric layer in the gate contact portion to expose the gate electrode;
depositing a metal layer over the patterned etch stop layer and the active channel layer; and
etching the metal layer using a forth mask to define a source electrode and a drain electrode at the device portion and a metal contact in the gate contact portion.

11. The method of claim 10, wherein the metal layer and the semiconductive active layer are etched using a plasma etching process.

12. The method of claim 10, wherein the semiconductive active layer is etched using a wet etching process and the metal layer is etched using a plasma etching process.

13. The method of claim 10, wherein the semiconductive active layer and the metal layer are etched using a wet etching process.

14. A thin film transistor formation method, comprising:
depositing and patterning a gate electrode over a substrate using a first mask;
depositing a gate dielectric layer over the gate electrode;
depositing a semiconductive active layer over the gate dielectric layer, the semiconductive active layer comprising oxygen, nitrogen, and one or more elements selected from the group consisting of zinc, indium, cadmium, gallium, and tin;

depositing first metal layer having a first composition over the semiconductor active layer;

depositing a second metal layer having a second composition different than the first composition over the first metal layer;

etching the second metal layer using a second mask to form one or more etch stops over a device portion of the thin film transistor while removing the second metal layer from a gate contact portion of the thin film transistor;

forming a third mask over the etched second metal layer;

etching the first metal layer to remove the first metal layer from the gate contact portion and to form an etched first metal layer over the device portion;

etching the semiconductive active layer to form an active channel in the device portion and to remove the semiconductive active layer from the gate contact portion; and etching the etched first metal layer to form source and drain electrodes.

15. The method of claim 14, wherein the etching the second metal layer comprises wet etching.

16. The method of claim 15, wherein etching the first metal layer comprises plasma etching.

17. The method of claim 16, wherein etching the semiconductive active layer comprises wet etching.

18. The method of claim 17, wherein etching the first metal layer comprises plasma etching.

19. The method of claim 18, wherein the semiconductive active layer is deposited by applying a DC electrical bias to a metallic sputtering target comprising the one or more elements selected from the group consisting of zinc, indium, cadmium, gallium, and tin, and introducing an oxygen containing gas and a nitrogen containing gas.

20. The method of claim 19, wherein the oxygen containing gas and the nitrogen containing gas are separate gases, wherein the metallic sputtering target comprises a dopant selected from the group consisting of Al, Sn, Ga, Ca, Si, Ti, Cu, Ge, In, Ni, Mn, Cr, V, Mg, $Si_xN_y$, $Al_xO_y$, SiC, and combinations thereof, and wherein the semiconductive active layer comprises a dopant selected from the group consisting of Al, Sn, Ga, Ca, Si, Ti, Cu, Ge, In, Ni, Mn, Cr, V, Mg, $Si_xN_y$, $Al_xO_y$, SiC, and combinations thereof.

* * * * *